(12) United States Patent
Koepp et al.

(10) Patent No.: US 11,423,278 B1
(45) Date of Patent: Aug. 23, 2022

(54) RFID INTEGRATED CIRCUITS WITH LARGE CONTACT PADS

(71) Applicant: Impinj, Inc., Seattle, WA (US)

(72) Inventors: Ronald L. Koepp, Seattle, WA (US); Harley K. Heinrich, Snohomish, WA (US); Christopher J. Diorio, Shoreline, WA (US); Tan Mau Wu, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 17/209,514

(22) Filed: Mar. 23, 2021

Related U.S. Application Data

(63) Continuation of application No. 16/441,053, filed on Jun. 14, 2019, now abandoned, which is a continuation of application No. 14/956,412, filed on Dec. 2, 2015, now Pat. No. 10,331,993, which is a continuation of application No. 14/132,959, filed on Dec. 18, 2013, now abandoned, and a continuation-in-part of application No. 13/945,490, filed on Jul. 18, 2013, now Pat. No. 9,495,631, which is a continuation-in-part of application No.
(Continued)

(51) Int. Cl.
*G06K 19/077* (2006.01)
*H01L 21/768* (2006.01)
*H01L 23/528* (2006.01)

(52) U.S. Cl.
CPC .. *G06K 19/07754* (2013.01); *H01L 21/76802* (2013.01); *H01L 21/76877* (2013.01); *H01L 23/528* (2013.01)

(58) Field of Classification Search
CPC ......... H01L 21/76877; H01L 21/76819; H01L 21/4867; H01L 21/76873; H01L 21/76802; H01L 2924/14; H01L 23/528; H01L 29/40114; G06K 19/0775; G06K 19/07752; G06K 19/07756; G06K 19/07758; G06K 19/07754
See application file for complete search history.

(56) References Cited

U.S. PATENT DOCUMENTS 6,246,327 B1 * 6/2001 Eberhardt ............... H01L 24/24
257/758
6,440,773 B1 * 8/2002 Usami ..................... G06K 19/07
257/E23.064
(Continued)

OTHER PUBLICATIONS

Final Office Action received for U.S. Appl. No. 12/938,092, dated Mar. 14, 2013.
(Continued)

*Primary Examiner* — Thien T Mai
(74) *Attorney, Agent, or Firm* — Mannava & Kang, P.C.

(57) ABSTRACT

A Radio Frequency Identification (RFID) integrated circuit (IC) is at least partially covered by a repassivation layer that is, in turn, at least partially covered by a large, electrically conductive contact pad. The repassivation layer is disposed so as to leave uncovered at least one IC contact. The large contact pad is disposed so as to cover the IC IC contact. The large contact pad forms a first galvanic coupling to the IC contact and a second galvanic coupling to a tag antenna. The surface area of the first galvanic coupling is substantially smaller than the surface area of the second galvanic coupling.

17 Claims, 15 Drawing Sheets

Related U.S. Application Data

13/069,171, filed on Mar. 22, 2011, now Pat. No. 8,511,569, which is a continuation-in-part of application No. 13/069,171, filed on Mar. 22, 2011, now Pat. No. 8,511,569, and a continuation-in-part of application No. 12/938,092, filed on Nov. 2, 2010, now abandoned.

(60) Provisional application No. 61/353,754, filed on Jun. 11, 2010.

(56) References Cited

U.S. PATENT DOCUMENTS

| | | | |
|---|---|---|---|
| 7,551,141 B1 * | 6/2009 | Hadley | G06K 19/07718 343/700 MS |
| 2004/0183182 A1 * | 9/2004 | Swindlehurst | H01L 23/5389 257/686 |
| 2005/0035924 A1 | 2/2005 | Liu et al. | |
| 2005/0134506 A1 | 6/2005 | Egbert | |
| 2006/0057763 A1 | 3/2006 | Teo et al. | |
| 2007/0148981 A1 * | 6/2007 | Rogge | H01L 24/05 438/700 |
| 2009/0269886 A1 | 10/2009 | Yamazaki et al. | |
| 2009/0294542 A1 | 12/2009 | Rogy et al. | |
| 2010/0127084 A1 | 5/2010 | Pavate et al. | |
| 2010/0308118 A1 | 12/2010 | Kataya et al. | |

OTHER PUBLICATIONS

Final Office Action received for U.S. Appl. No. 12/938,092, dated Nov. 15, 2012 and filed Feb. 14, 2013.

Final Office Action received for U.S. Appl. No. 13/945,490, dated Feb. 26, 2015 and filed May 22, 2015.

Final Office Action received for U.S. Appl. No. 13/945,490, dated Feb. 8, 2016.

Final Office Action received for U.S. Appl. No. 14/132,959, dated Jul. 14, 2015.

Final Office Action received for U.S. Appl. No. 14/956,412, dated Aug. 9, 2016.

Final Office Action received for U.S. Appl. No. 16/441,053, dated Oct. 30, 2020.

Office Action received for U.S. Appl. No. 13/069,171, dated Jan. 29, 2013 and filed Mar. 1, 2013.

Office Action received for U.S. Appl. No. 13/945,490, dated Jul. 9, 2015 and filed Dec. 9, 2015.

Office Action received for U.S. Appl. No. 13/945,490, dated Nov. 24, 2014 and filed Jan. 27, 2015.

Office Action received for U.S. Appl. No. 14/132,959, dated Mar. 3, 2015 and filed Jun. 2015.

Office Action received for U.S. Appl. No. 14/956,412, dated Apr. 22, 2016 and filed Jun. 1, 2016.

Office Action received for U.S. Appl. No. 16/441,053, dated Jun. 6, 2020 and filed Sep. 24, 2020.

* cited by examiner

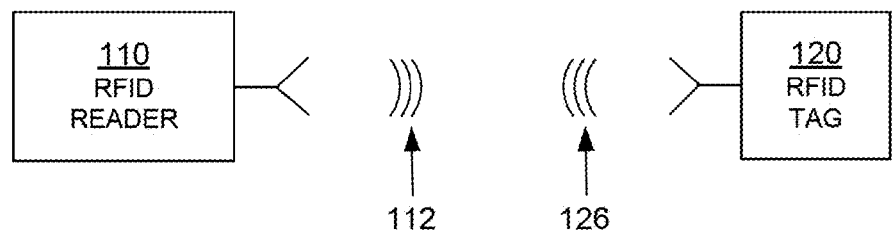
FIG. 1
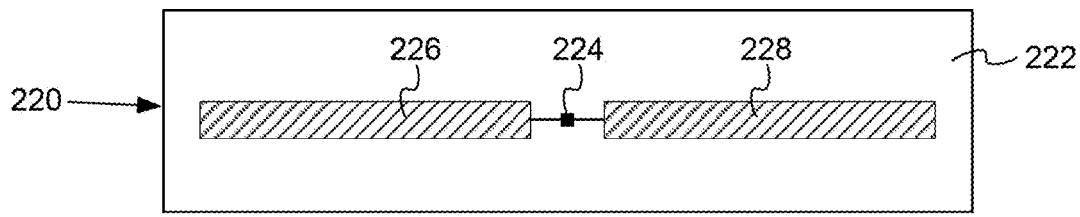
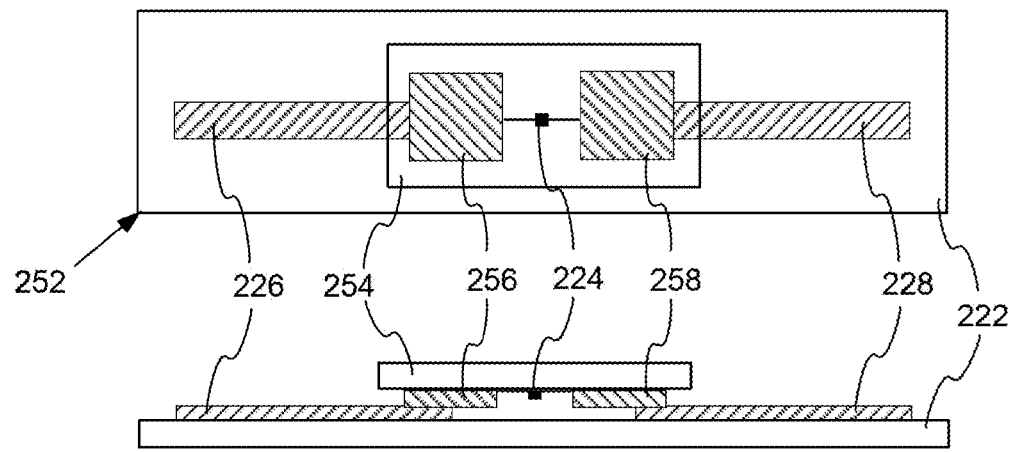
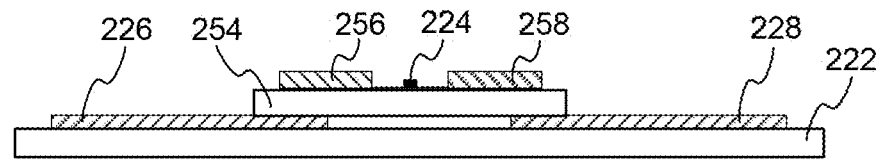
FIG. 2

*SIGNAL PATH DURING R→T*

*SIGNAL PATH DURING T→R*

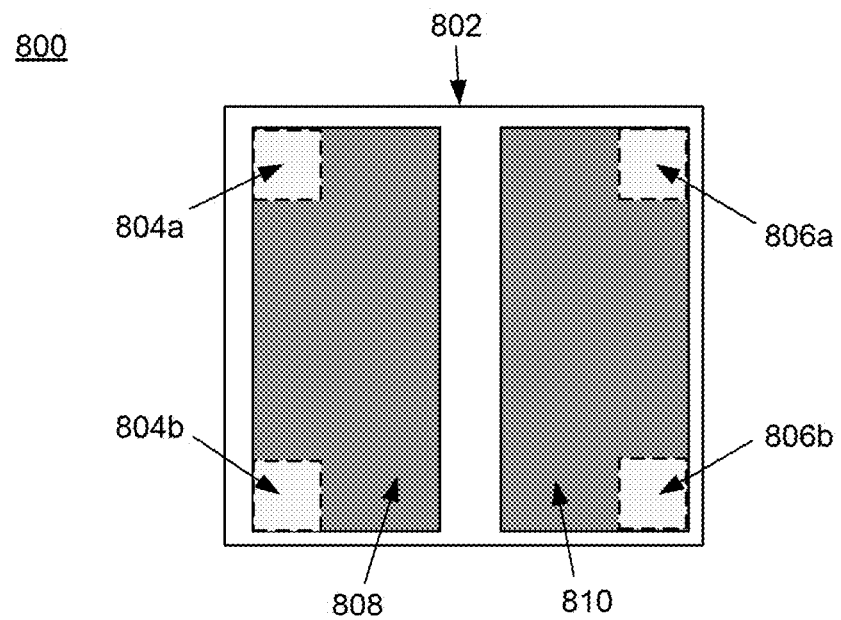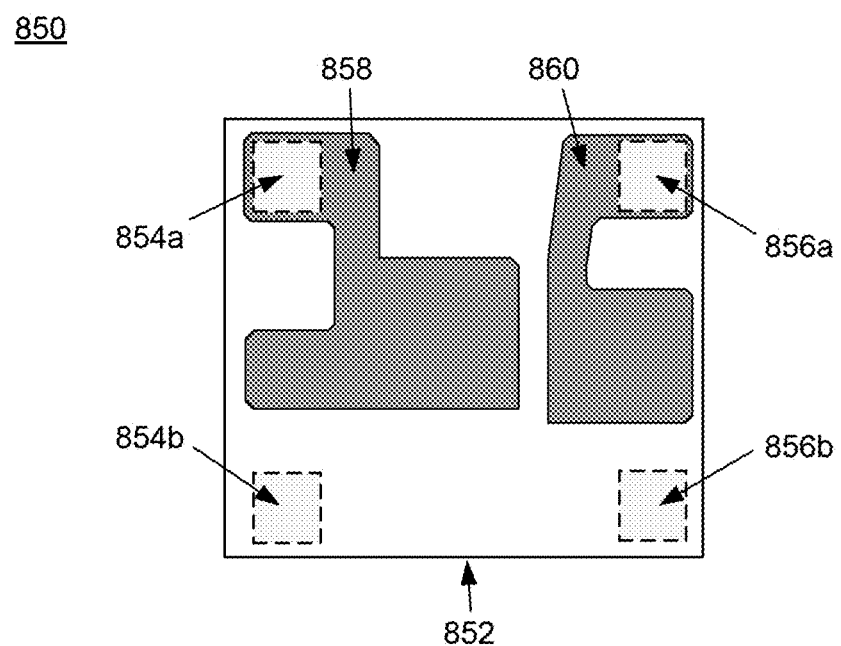
FIG. 8

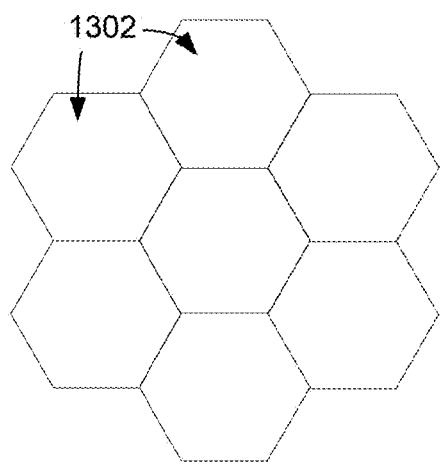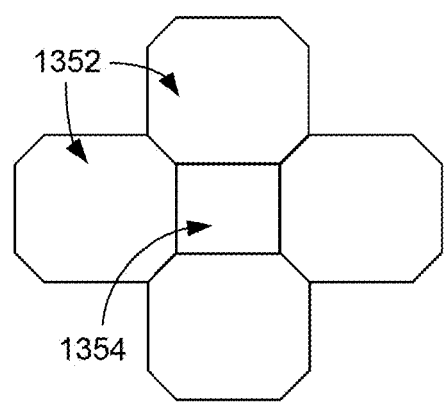
FIG. 13

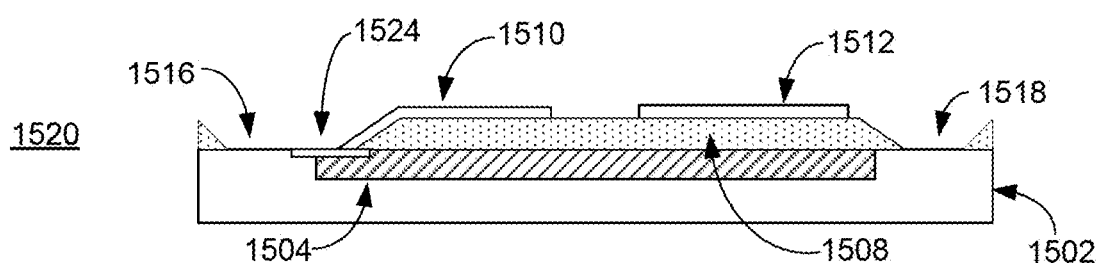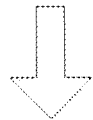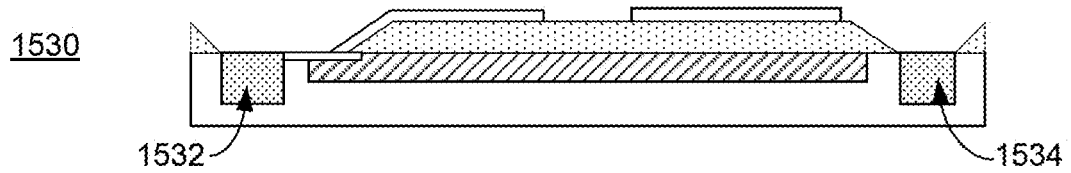
FIG. 15

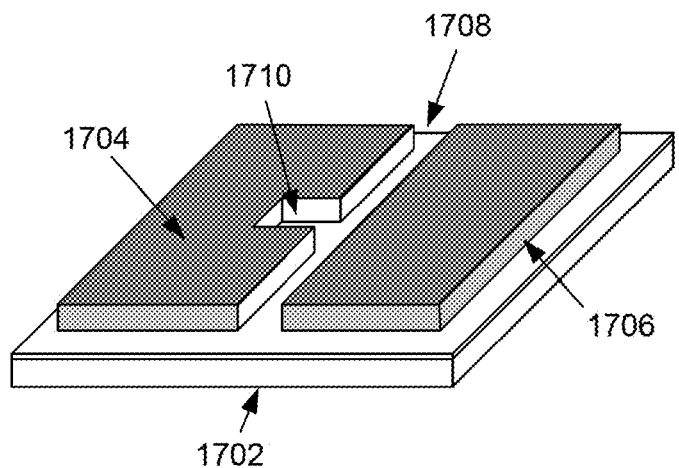
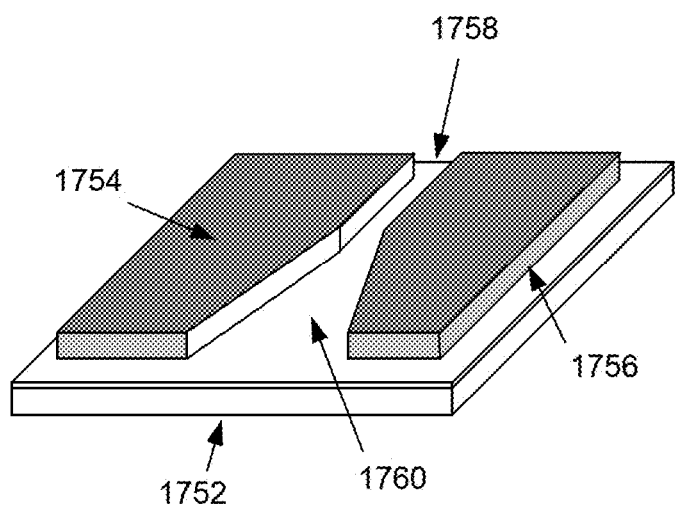
FIG. 17

RFID INTEGRATED CIRCUITS WITH LARGE CONTACT PADS

CROSS REFERENCE TO RELATED APPLICATIONS

This application is a continuation of U.S. patent application Ser. No. 16/441,053 filed on Jun. 14, 2019, which is a continuation of U.S. patent application Ser. No. 14/956,412 filed on Dec. 2, 2015, now U.S. Pat. No. 10,331,993, which is a continuation of U.S. patent application Ser. No. 14/132,959 filed on Dec. 18, 2013, which is a continuation of U.S. patent application Ser. No. 13/069,171 filed on Mar. 22, 2011, now U.S. Pat. No. 8,511,569, which is a continuation-in-part of U.S. application Ser. No. 12/938,092, filed Nov. 2, 2010, which in turn claims benefit of U.S. Provisional Application Ser. No. 61/353,754, filed Jun. 11, 2010.
The parent application (Ser. No. 14/956,412) is in turn a continuation-in-part of U.S. patent application Ser. No. 13/945,490 filed on Jul. 18, 2013, now U.S. Pat. No. 9,495,631, which is in turn a continuation-in-part of U.S. patent application Ser. No. 13/069,171 filed on Mar. 22, 2011, now U.S. Pat. No. 8,511,569. The disclosures of the foregoing patent application and patent are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF wave may respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on. Accordingly, when a reader receives tag data it can learn about the item that hosts the tag and/or about the tag itself.

An RFID tag typically includes an antenna section, a radio section, a power-management section, and frequently a logical section, a memory, or both. In some RFID tags the power-management section included an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to an RFID tag integrated circuit (IC) having large contact pads formed from large conductive contact surfaces on a repassivation layer. The large contact pads may be additionally formed on raised contact islands by removing, partially or completely, regions of the repassivation layer that are not covered by the contact pads. The removal may be accomplished by a strip process that also removes an IC etch or implant mask layer, and may be a by-product of that strip process.

Embodiments are also directed to assembling an RFID tag using B-stage adhesives. A B-stage adhesive is applied to ICs and partially cured. The ICs are then deposited onto preheated inlays. The preheated inlays cause the B-stage adhesive on the ICs to bind to the inlays. In some embodiments the B-stage adhesive is applied to the large contact pads.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which:

FIG. 1 is a block diagram of components of an RFID system.

FIG. 2 is a diagram showing components of passive RFID tags formed by a variety of methods; each can be used in the system of FIG. 1.

FIG. 8 depicts patterned contact pads according to embodiments.

FIG. 13 depicts non-square RFID ICs that may be formed using the singulation process of FIG. 11, according to embodiments.

FIG. 15 illustrates how a repassivation layer may serve as a mask in an etching process, according to embodiments.

FIG. 17 depicts patterned contact islands according to embodiments.

DETAILED DESCRIPTION

Figure 3:
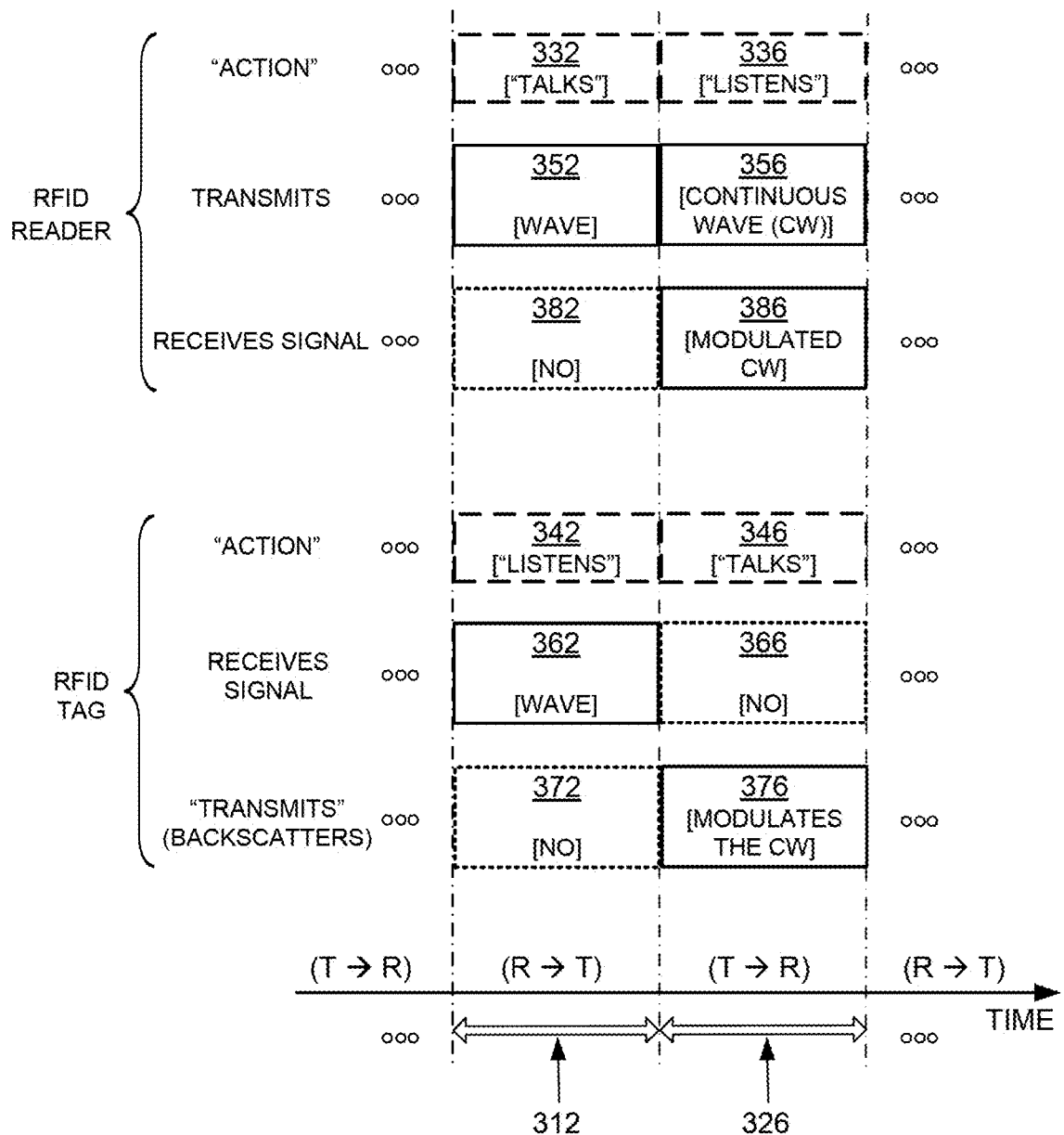
FIG. 3 is a conceptual diagram for explaining a half-duplex mode of communication between the components of the RFID system of FIG. 1.

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions. "Protocol" refers to an industry standard for communications between a reader and a tag (and vice versa), such as the Class-1 Generation-2 UHF RFID Protocol for Communications at 860 MHz-960 MHz by EPCglobal, Inc. ("Gen2 Specification"), version 1.2.0 of which is hereby incorporated by reference.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals).

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable IC contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the term "electrically isolated" as used herein may mean that electrical coupling of one or more types (e.g., galvanic, capacitive, and/or inductive) is not present, at least to the extent possible. For example, elements that are electrically isolated from each other may be galvanically isolated from each other, capacitively isolated from each other, and/or inductively isolated from each other.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed, for example, by crimping strap contacts 256/258 to antenna segments 226/228. In some embodiments the positions of strap substrate 254 and inlay 222 may be reversed, with strap substrate 254 mounted beneath strap substrate 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the IC contacts of IC 224 can modulate the antenna's reflectance, as can varying the admittance of a shunt-connected circuit element which is coupled to the IC contacts. Varying the impedance of a series-connected circuit element is another means of modulating the antenna's reflectance.

In the embodiments of FIG. 2, antenna segments 226 and 228 are separate from IC 224. In other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

The components of the RFID system of FIG. 1 may communicate with each other in any number of modes. One such mode is called full duplex. Another such mode is called half-duplex, and is described below.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

Figure 4:
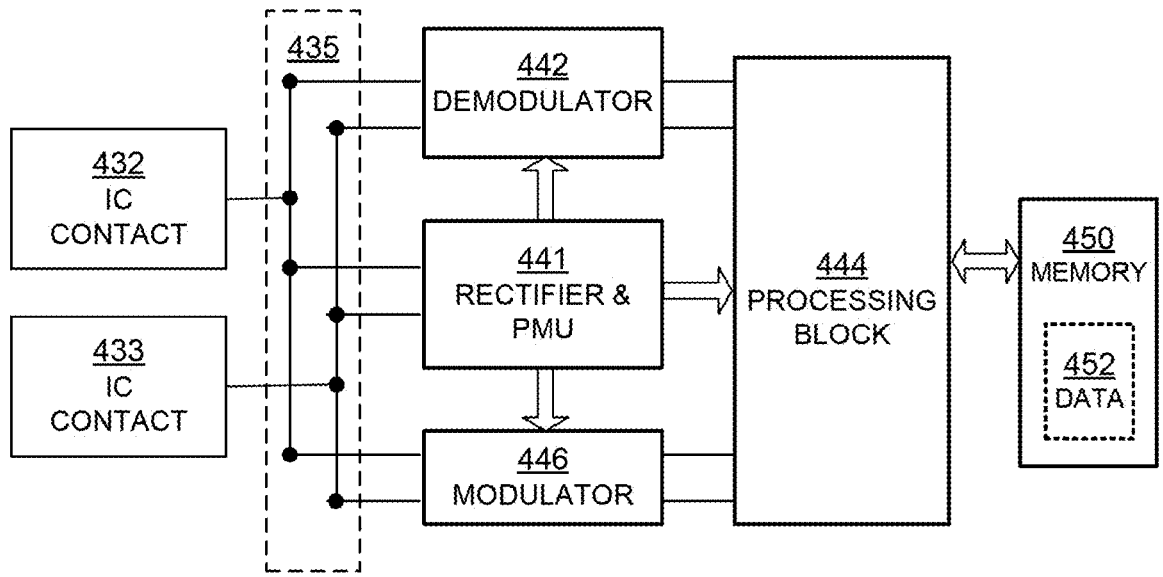
FIG. 4 is a block diagram showing a detail of an RFID integrated circuit (IC) for an RFID tag, such as the ICs and tags shown in FIG. 2.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two IC contacts 432, 433, suitable for coupling to antenna segments such as segments 226 and 228 of RFID tag 220 of FIG. 2. When two IC contacts form the signal input from, and signal return to, an antenna they are often referred-to as an antenna port. IC contacts 432, 433 may be made in any suitable way, such as from metallic pads and so on. In some embodiments circuit 424 uses more than two IC contacts, especially when tag 220 has more than one antenna port and/or more than one antenna.

Circuit 424 also includes signal-routing section 435 which may include signal wiring, a receive/transmit switch that can selectively route a signal, and so on.

Circuit 424 also includes a rectifier and PMU (Power Management Unit) 441 that harvests energy from the RF signal received by antenna segments 226 and 228 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via IC contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving IC contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a Nonvolatile Memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

Figure 5A:
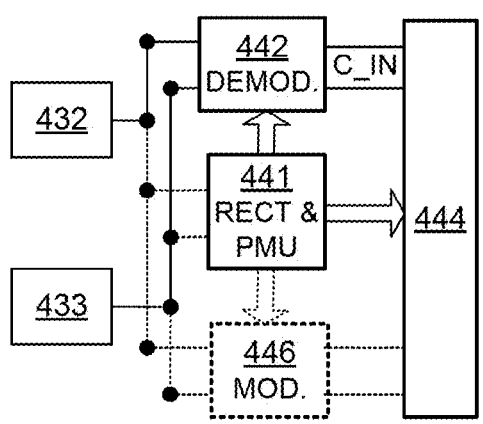
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session during time interval 312 of FIG. 3. Demodulator 442 demodulates an RF signal received from IC contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

Figure 5B:
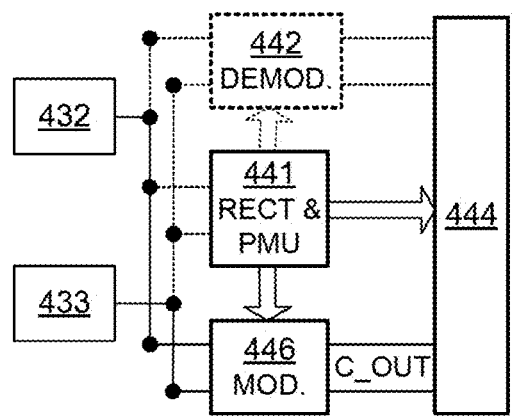

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 226/228 of RFID tag 220 via IC contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification referenced above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications.

In the above, an RFID reader/interrogator may communicate with one or more RFID tags in any number of ways. Some such ways are described in protocols. A protocol is a specification or industry standard that calls for specific manners of signaling between the reader and the tags. For example, the Gen2 Specification referenced above is one such protocol. In addition, a protocol can be a variant of a stated specification such as the Gen2 Specification, for example including fewer or additional commands than the stated specification calls for, and so on. In such instances, additional commands are sometimes called custom commands.

An RFID tag may be manufactured by physically attaching an RFID IC to a tag inlay having a substrate and an antenna, and electrically coupling the RFID IC to the antenna. For example, the RFID IC may be pressed onto the tag inlay and then electrically coupled to the antenna via one or more contact bumps on the IC and/or on the antenna. However, one challenge with this manufacturing method is that the mounting force for pressing the IC and the tag inlay together may vary from tag to tag, in turn affecting the electrical properties and performance of the completed tag. An RFID IC and its coupled antenna form a tuned circuit whose tuning varies, in part, with the amount of unwanted parasitic capacitive coupling between circuits in the IC and the antenna. This parasitic mounting capacitance can be quantified as:

$$C = \varepsilon_0 \varepsilon_r \frac{A}{d} \quad [1]$$

where $\varepsilon_0$ is the free-space permittivity, $\varepsilon_r$ is the relative permittivity, A is the area of the overlap between the antenna and the circuits, and d is the distance between the antenna and the circuits. Ideally, the area A varies by only a small amount, both because an RFID IC can typically be placed onto the inlay with good placement accuracy, and because the overlap is approximately constant even if the IC is not placed accurately because this capacitance is distributed over the entire area of the IC-to-antenna overlap. The distance d, however can change significantly with the mounting force applied during the mounting process, causing correspondingly significant changes in capacitance C. Hence, variations in mounting force result in tags with varying mounting capacitances and therefore varying tuning.

Figure 6:
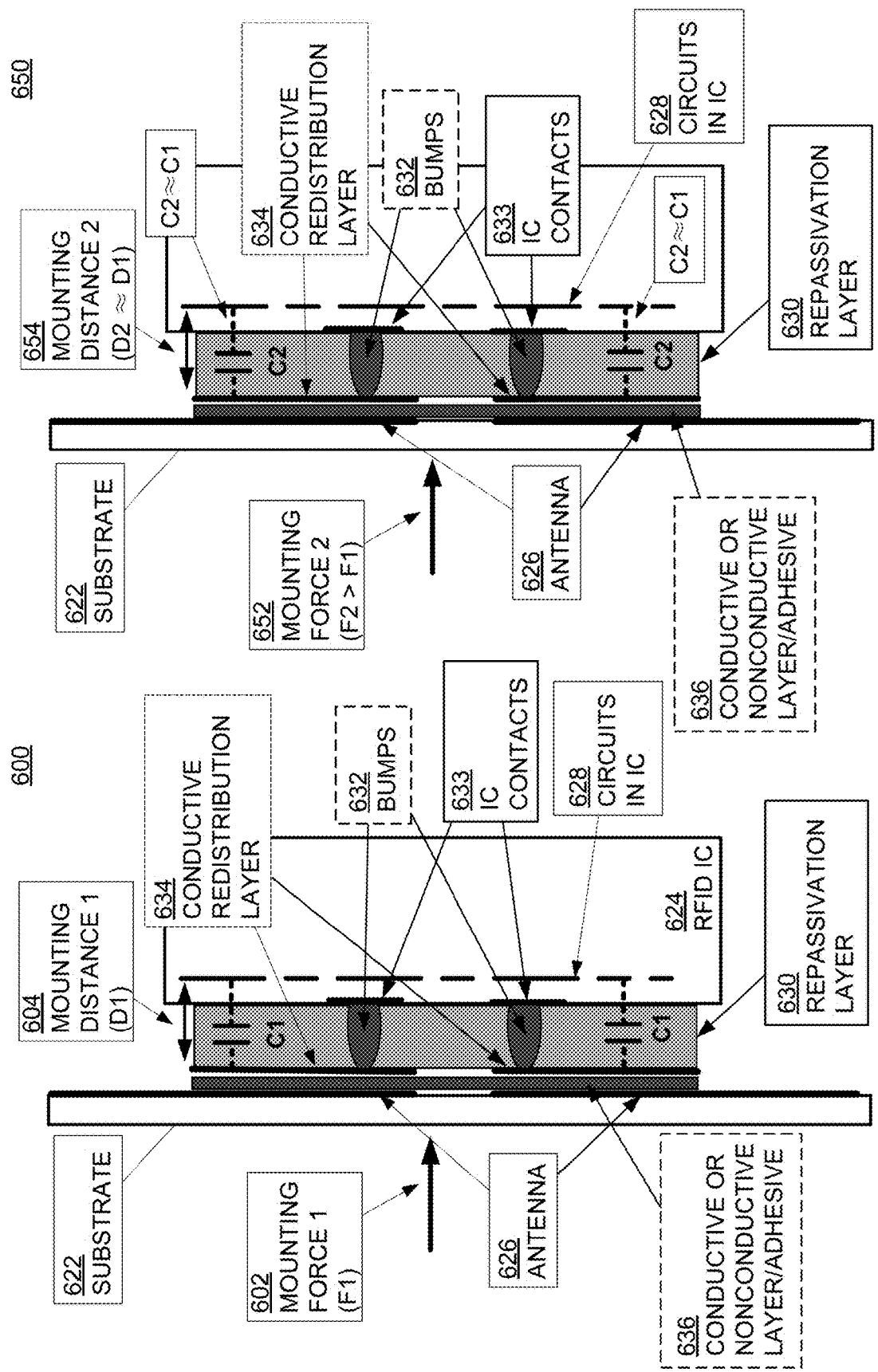
FIG. 6 illustrates tag antenna mounting with a repassivation layer to reduce variations in mounting capacitance between an IC and a tag antenna layer according to embodiments.

In embodiments, a nonconductive repassivation layer may be used to reduce variations in mounting capacitance. The repassivation layer may cover a surface of the IC, be disposed between the IC and a substrate, or be disposed between IC contact pads and the rest of the IC, as depicted in FIG. 6. In some embodiments the repassivation layer mitigates mounting-capacitance variations by ensuring a fixed distance between the circuits of the IC and the antenna layer. In other embodiments the repassivation layer mitigates parasitic capacitance variations between circuits of the IC and large IC contact pads, again by ensuring a fixed distance between these circuits and the contact pads.

FIG. 6 illustrates IC-to-tag antenna mounting with a repassivation layer to reduce mounting-capacitance variations.

FIG. 6 shows a diagram 600 in which an RFID strap or inlay comprising substrate 622 and antenna terminals 626 is pressed against RFID IC 624 with a mounting force F1 (602), where antenna terminals 626 are separated from IC 624 by at least a repassivation layer 630. Mounting distance D1 (604) is fixed by repassivation layer 630, producing a similarly fixed mounting capacitance C1.

Diagram 650 shows the RFID strap or inlay being pressed against the RFID IC with a mounting force F2 (652) which is larger than mounting force F1 (602). The repassivation layer 630 ensures that mounting distance D2 (654) is substantially the same as mounting distance D1 (604) despite the larger mounting force F2. As a result, mounting capacitance C2 is substantially similar to mounting capacitance C1, helping ensure that the tags have similar tuning and consequent similar performance.

In some embodiments a conductive redistribution layer 634 covers a large portion of the surface of either RFID IC 624 or repassivation layer 630. Conductive redistribution layer 634 may be metal (e.g., copper, aluminum, gold, palladium, or any other suitable metal), doped silicon, graphene, or another material that is electrically conductive or possesses metallic properties. Conductive redistribution layer 634 may be applied or deposited on repassivation layer 630, for example by evaporation, sputtering, or direct transfer.

Repassivation layer 630 and/or conductive redistribution layer 634 may be confined within at least a portion of a surface of IC 624. For example, repassivation layer 630 may be confined within the perimeter of IC 624, and redistribution layer 634 may be confined within the perimeter of repassivation layer 630. In other embodiments, repassivation layer 630 and/or redistribution layer 634 may extend beyond the perimeter of IC 624. For example, at least a portion of repassivation layer 630 may extend beyond the perimeter of IC 624, or at least a portion of redistribution layer 634 may extend beyond the perimeter of repassivation layer 630. In some embodiments, the portions of repassivation layer 630/redistribution layer 634 that extend beyond a perimeter of the underlying surface (e.g., that of IC 624 or repassivation layer 630) may be removed by stripping, etching, or as a by-product of singulating IC 624.

Repassivation layer 630 and/or conductive redistribution layer 634 may also be deposited or processed to have a particular pattern. For example, repassivation layer 630 may have a pattern of any desired shape that uncovers all or a portion of IC contacts 633, uncovers other portions of the surface of IC 624, and/or covers an entire surface of IC 624. Similarly, redistribution layer 634 may be patterned to form contact pads, strips, or any other desired shape, and may cover all or a portion of IC contacts 633. The patterning of repassivation layer 630 and/or redistribution layer 634 may be performed using a masking step to define the desired pattern (e.g., with a masking layer) and an etching step (if masking occurs after layer deposition) or a liftoff/removal step (if masking occurs before layer deposition). In some embodiments, repassivation layer 630 and/or redistribution layer 634 may be applied to another substrate, optionally patterned, and then transferred to IC 624.

In some embodiments, repassivation layer 630 may include an air gap that separates conductive redistribution layer 634 from IC 624 to further decouple the two capacitively. The air gap may be bridged by support pillar(s) between conductive redistribution layer 634 and IC 624 (including contacts that electrically couple the two). In some embodiments, conductive redistribution layer 634 may employ a mesh structure to further reduce the capacitive coupling.

Conductive redistribution layer 634 may comprise a single or multiple portions. For example, conductive redistribution layer 634 on repassivation layer 630 may be patterned to provide multiple contact areas electrically isolated from each other.

As described above, repassivation layer 630 may have a pattern that uncovers at least a portion of IC contacts 633. For example, repassivation layer 630 may be patterned to leave openings over at least a portion of IC contacts 633, or may be patterned such that at least a portion of IC contacts 633 lie outside the periphery of repassivation layer 630. By contrast, redistribution layer 634 may have a pattern that covers at least a portion of IC contacts 633. In some embodiments, a first pattern of repassivation layer 630 and a second pattern of redistribution layer 634 may be chosen such that the portions of IC contacts 633 uncovered by the first pattern at least partially coincide with the portions of IC contacts 633 that are covered by the second pattern.

Redistribution layer 634 may be galvanically (i.e., conductively) connected to the portion(s) of IC contacts 633 uncovered by the first pattern and covered by the second pattern. In some embodiments, the second pattern may be deposited directly over portions of IC contacts 633 uncovered by the first pattern and processed to form galvanic connections to IC contacts 633 without the need for bumps or other intermediaries. For example, redistribution layer 634 may be deposited over openings in repassivation layer 630 that uncover portions of IC contacts 633, or may be deposited to extend beyond the periphery of repassivation layer 630 if portions of IC contacts 633 lie outside the periphery of repassivation layer 630. This latter embodiment is described in more detail below in FIG. 7. In other embodiments one or more bumps 632 may galvanically connect redistribution layer 634 and IC contacts 633.

In some embodiments, IC contacts 633 may be electrically coupled to redistribution layer 634 without uncovering portions of IC contacts 633. For example, portions of repassivation layer 630 may be made conductive, for example by doping via ion implantation, allowing IC contacts 633 to galvanically connect with redistribution layer 634 through these conductive portions. In another example, IC contacts 633 may capacitively couple to conductive redistribution layer 634 through repassivation layer 630.

Repassivation layer 630 may be an organic or inorganic material, typically (although not necessarily) with a relatively low dielectric constant and a reasonable thickness to minimize parasitic coupling capacitance as described above. Examples of organic materials include but are not limited to polyimide-based materials, Spheron™ WLP manufactured by RoseStreet Labs based in Phoenix, Ariz., or benzocyclobutene-based materials (e.g., bisbenzocyclobutene, BCB). An additional layer 636 may be applied between the IC and the strap/inlay to attach the IC to the strap/inlay, physically and/or electrically. Layer 636 may include an anisotropic conductive adhesive or layer, a patterned conductive adhesive or layer, and/or a nonconductive adhesive or layer. If layer 636 is nonconductive then it is typically sufficiently thin as to provide low-impedance capacitive coupling between antenna terminals 626 and conductive redistribution layer 634 at the frequencies of RFID communications. Whereas FIG. 6 shows layer 636 contacting both of the terminals of antenna 626 and both portions of conductive redistribution layer 634, in some embodiments layer 636 may be patterned to prevent antenna terminals 626 from coupling with each other, or to prevent portions of conductive redistribution layer 634 from coupling with each other. For example, layer 636 may be patterned such that a portion of conductive redistribution layer 634 only galvanically couples with one of the antenna terminals, and does not galvanically couple with the other antenna terminal or with other portions of conductive redistribution layer 634. Of course, in some embodiments layer 636 may not be present at all.

Figure 7:
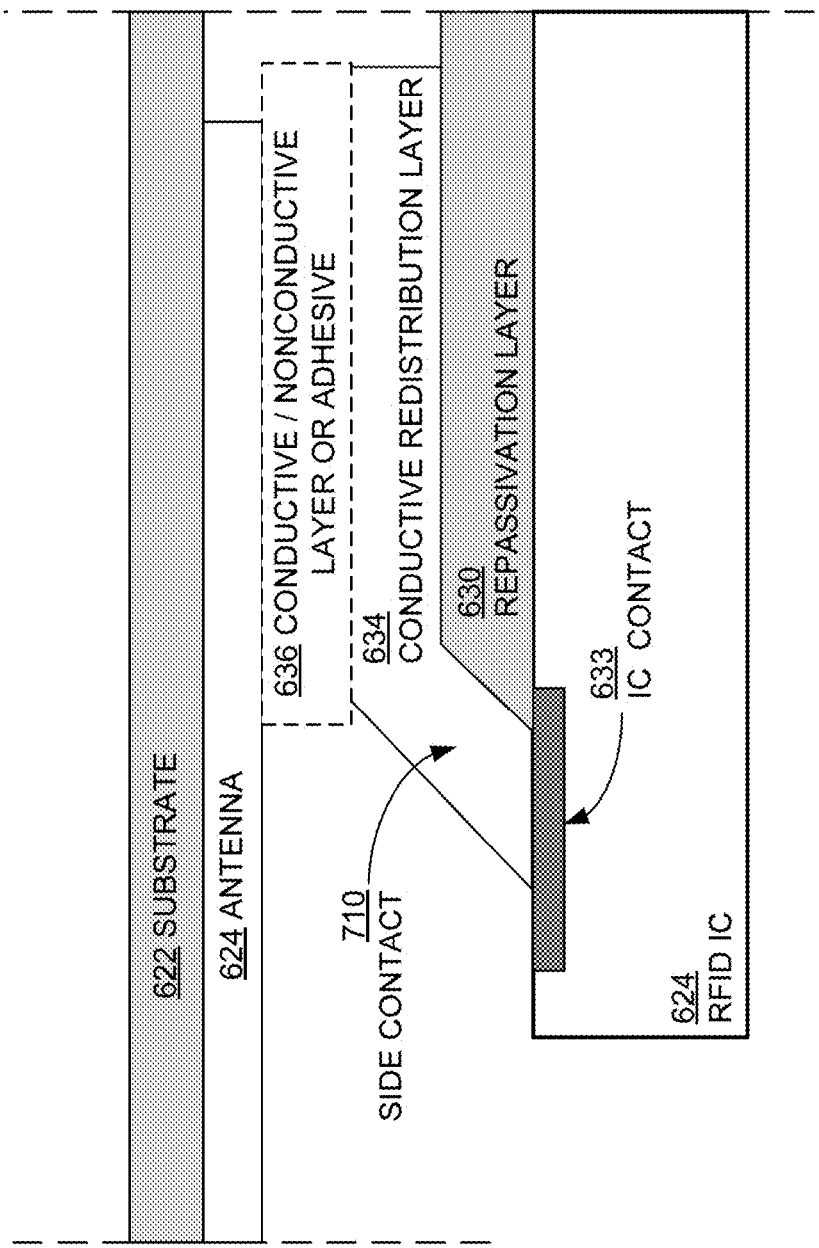
FIG. 7 illustrates a detailed cross-section of a conductive redistribution layer electrically coupling to an IC contact according to embodiments.

FIG. 7 illustrates a cross-section 700 of conductive redistribution layer 634 electrically coupling to IC contact 633 according to embodiments. As shown in cross-section 700, repassivation layer 630 is disposed on RFID IC 624 so as to at least partially cover one of its surfaces, leaving other portions of the surface uncovered. In FIG. 7 as shown, repassivation layer 630 optionally leaves uncovered a portion of IC contact 633. Also in FIG. 7 as shown, in some embodiments at least part of an edge of repassivation layer 630 may be sloped or beveled. Conductive redistribution layer 634 may be disposed on IC 624 so as to extend from the top of repassivation layer 630 down its sloped/beveled side, forming what may be referred to as a "side contact". Side contact 710 may further extend beyond the periphery of repassivation layer 630 and over at least a portion of IC contact 633, coupling galvanically or capacitively to a portion of IC contact 633. In some embodiments the extension of side contact 710 may couple to IC contact 633 directly, without intermediate contacts, bumps, or layers. In other embodiments one or more conductive and/or nonconductive contacts, bumps or layers may be interposed between the extension of side contact 710 and IC contact 633.

Conductive redistribution layer 634 also electrically couples to antenna 624 directly or through an optional conductive/nonconductive layer or adhesive 636, as described above. In some embodiments, in particular those similar to diagram 700, the region of electrical coupling between conductive redistribution layer 634 and antenna 624 substantially nonoverlaps the region of electrical coupling between conductive redistribution layer 634 and IC contact 633. In other words, the projection of the electrical interface area between conductive redistribution layer 634 and antenna 624 onto the surface of the IC 624 does not overlap the projection of the electrical interface area between conductive redistribution layer 634 and IC contact 633.

A conductive redistribution layer 634 that includes relatively large pads may also help to protect underlying repassivation layer 630 during IC fabrication. For example, conductive redistribution layer 634 may serve as an etch mask that covers and prevents etching or damage to underlying portions of repassivation layer 630 during processing like that described below in FIGS. 14 and 16 and in U.S. Pat. No. 7,482,251 issued on Jan. 27, 2009, the entirety of which is hereby incorporated by reference.

As described above, in many cases RFID ICs can be placed onto an inlay with relatively good placement accuracy. Accurate alignment of an IC to an inlay antenna allows proper coupling between the IC contacts and the antenna terminals. One way to couple the IC to the antenna terminals involves using metallic posts, also known as bumps. However, in some situations using bumps for coupling may be undesirable. Bumps form a stress point on the IC, reducing its strength and potentially resulting in IC breakage during further processing.

In embodiments according to the present invention, one or more relatively large conductive contact pads formed on the IC may be used instead of (or in addition to) bumps. Diagram 800 in FIG. 8 depicts a top view of IC 802 having large contact pads 808 and 810. In diagram 800 each large contact pad is electrically coupled to IC 802 via a pair of IC contacts, but more or less IC contacts can be used. In some embodiments the large contract pads 808 and 810 are galvanically coupled to the IC contacts, whereas in other embodiments the coupling may be capacitive or inductive.

As depicted in diagram 800, large contact pad 808 is electrically coupled to IC 802 via IC contacts 804*a* and 804*b*, and large contact pad 810 is electrically coupled to IC 802 via IC contacts 806*a* and 806*b*. Large contact pads 808 and 810 are, in turn, configured to provide capacitive or galvanic coupling to external electrical elements such as the antenna terminals on an RFID strap or inlay (e.g., antenna terminals 626). Large contact pads 808 and 810 provide more area for coupling to these external electrical elements, and as a result reduce the coupling impedance. They also reduce performance variations due to IC-to-antenna alignment accuracy because the predominant parasitic capacitive coupling is IC-to-contact pad rather than IC-to-antenna, and the IC-to-contact-pad alignment is typically very well controlled because the large contact pads are fabricated on IC 802.

In some embodiments, a dielectric or repassivation layer (e.g., repassivation layer 630) is first deposited on IC 802, and large contact pads 808/810 are formed on the repassivation layer and then electrically coupled to the IC contacts. The coupling between the large contact pads and the IC contacts may be capacitive or galvanic. When capacitive, the coupling may be adjusted via the dielectric characteristics (e.g. composition, thickness) of the material disposed between the contact pads and the antenna (e.g., layer 636). This material may be nonconductive material covering the pads, nonconductive material covering the antenna traces (e.g. a naturally grown or enhanced oxide layer on aluminum traces), and/or any additional dielectric material. Galvanic coupling may be enhanced by pressing an antenna onto the IC such that one or more "dimples" formed on the antenna make direct contact with one or more of the large contact pads on the IC. In some embodiments, the dimples are instead formed on the large contact pads. In some embodiment the dimples break through the nonconductive covering material. In other embodiments, galvanic coupling may be accomplished without dimples or bumps, such as by direct contact or by means of an etchant to remove the nonconductive covering material.

Large contact pads 808/810 may cover a significant portion of the top surface of IC 802. For example, large contact pads 808/810 may cover more than 20%, 30%, 40%, 50%, 60%, 70%, 80%, 90%, or even up to 100% of the top surface of IC 802. Regardless of the amount of coverage, large contact pads 808/810 are distinguishable from bumps by their predisposition to have at least one of (1) a surface area that is a significant fraction of the size of underlying IC 802, (2) a surface area that is many times larger than that of underlying IC contacts 633, (3) a low aspect ratio (height versus width or height versus surface area), and/or (4) a flat or textured-flat top. By contrast, bumps typically have (1) a surface area that is small relative to the size of underlying IC 802, (2) a surface area that is similar or perhaps twice that of underlying IC contacts 633, (3) a high aspect ratio (height versus width or height versus surface area), and (4) a rounded top. In addition, large contact pads 808/810 tend to have an as-designed shape, whereas bumps tend to assume a shape similar that of their underlying IC contacts (i.e. circular-looking if the underlying bumps are circular or octagonal-looking if the underlying IC contacts are octagonal). Of course, not all of these differences are required or absolute, but a large contact pad is easily distinguishable from a bump by one of ordinary skill in the art.

In some embodiments, large contact pads on a surface of an IC are confined within or extend up to that surface's perimeter. In other embodiments, large contact pads may extend out beyond the perimeter of an IC surface and may wrap around or encroach onto neighboring IC surfaces, or even extend outward from the IC surface in a cantilevered fashion.

Whereas large contact pads 808/810 in diagram 800 are shown as substantially rectangular, large contact pads do not need to be rectangular. Large contact pads may be circular, annular, or may be designed to have any suitable shape.

Diagram 850 depicts a top view of IC 852 with one IC contact pair having contacts 854a and 854b (similar to contacts 804a and 804b) and another IC contact pair having contacts 856a, 856b (similar to contacts 806a and 806b). Large contact pads 858 and 860 overlie and electrically couple to IC contacts 854a and 856a, respectively. IC contact pads 854b and 856b may remain electrically isolated, may couple to other electrical elements, may have any other purpose, or may not even exist.

Large contact pads 858 and 860 may be fabricated and shaped by patterning a conductive redistribution layer as described above in reference to FIG. 6. The shapes and/or orientations of the contact areas may be based on aesthetics, ease of electrically coupling to antenna terminals, ease of etching or forming, utility as an etch-stop in an etching step, reducing parasitic coupling to sensitive components in IC 802/852, or for any other reason. In some embodiments large contact pads may be patterned so that regions whose local parasitic capacitance to IC 802/852 (or elements in IC 802/852) would exceed a threshold are excised. The portions may be removed after deposition or not deposited in the first place. The threshold(s) may be determined based on, for example, a desired parasitic capacitance of the entire IC or a desired local parasitic capacitance of a portion of the IC. Also as shown in diagram 850, contact areas 808 and 810 may have curved or rounded edges, for example to ease masking, etching, and/or liftoff patterning processes.

As shown above in FIGS. 6-8, the surface area of a conductive redistribution layer (e.g., redistribution layer 634) or a large contact pad fashioned from such a redistribution layer (e.g., contact pad 808) that is available for electrical coupling to an antenna is typically much larger than the surface area of the interface between the redistribution layer and the IC contact (e.g., IC contact 633 or contact 804a). For example, the surface area of large contact pad 808 is shown to be substantially larger than the total surface area of the interface between large contact pad 808 and IC contacts 804a and 804b. Likewise, the surface area of large contact pad 810 is shown to be substantially larger than the total surface area of the interface between large contact pad 810 and IC contacts 806a and 806b. In some embodiments, the surface area of a large contact pad available for electrical coupling to an antenna may be at least three times (300%), five times (500%), ten times (1000%), or even twenty times (2000%) or more larger than the surface area of the interface between the large contact pad and one or more IC contacts.

Figure 9:
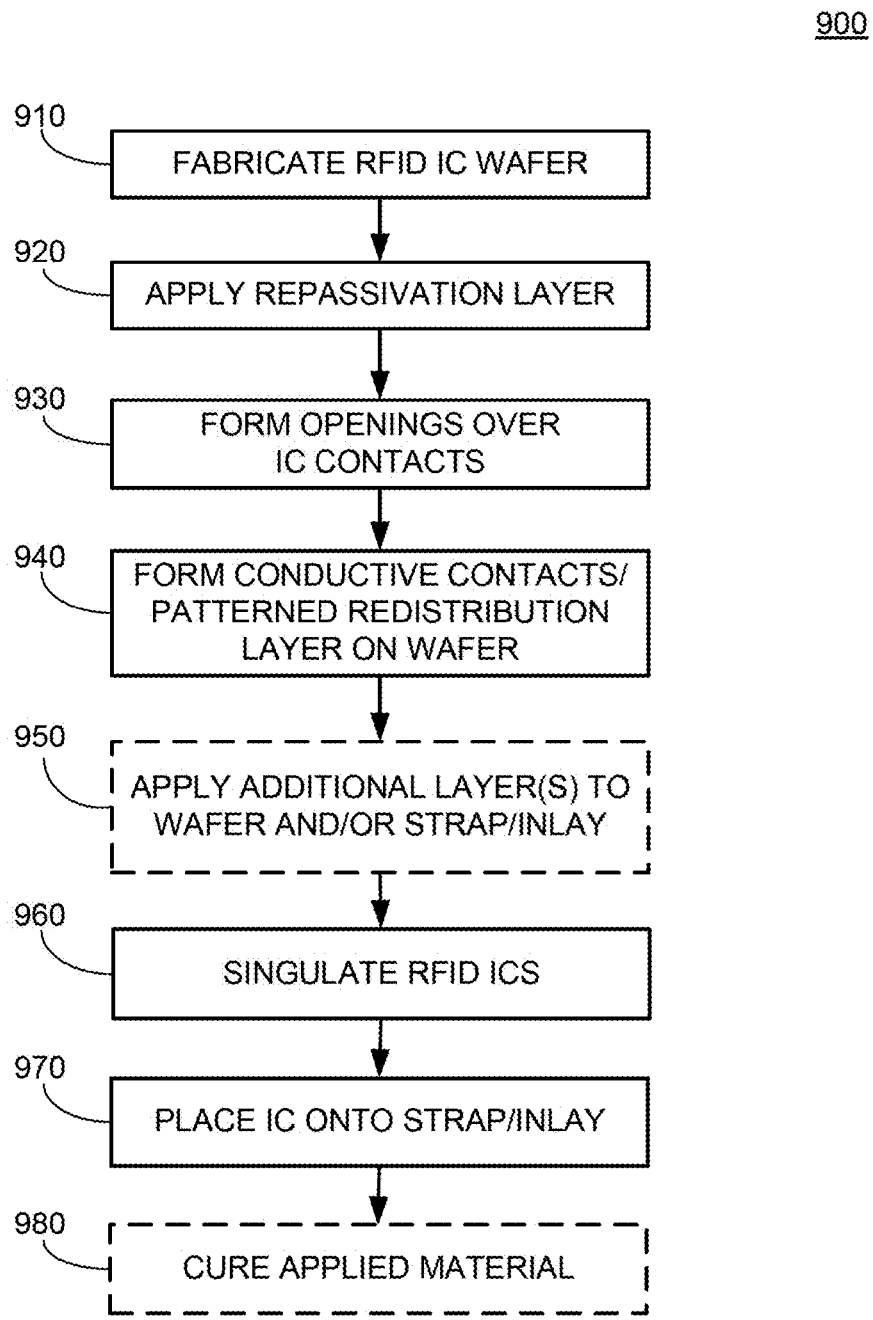
FIG. 9 is a flowchart of a process for fabricating an RFID tag with a repassivation layer according to embodiments.

FIG. 9 is a flowchart of process 900 for fabricating an RFID tag with a repassivation layer according to embodiments. Process 900 begins with step 910, where an RFID wafer is fabricated. An RFID wafer typically includes multiple RFID ICs as described above. At step 920 a repassivation layer is applied to the wafer. This repassivation layer may be an organic material. Subsequently, or as part of forming the repassivation layer, at step 930 openings are formed in the repassivation layer and over the ICs' IC contacts, for example using techniques such as masking and/or etching. Next, at step 940, a conductive redistribution layer is formed over the repassivation layer, typically patterned to form large contact pads as described with reference to FIG. 8. Also in step 940, conductive contacts, bumps or portions of the conductive redistribution layer deposited in the openings electrically couple the large contact pads to IC contacts of the IC.

In some embodiments, one or more additional layers (e.g., layer/adhesive 636) may be applied to the wafer at optional step 950. These additional layers may include an anisotropic conductive layer, an isotropic conductive layer, and/or a nonconductive layer, and may be organic, inorganic (e.g., metal), or a combination thereof. In some embodiments the additional layers may be patterned. The additional layers may also include adhesives for affixing the ICs to inlays. In some embodiments, the additional layers may be applied to inlays instead of to the wafer.

At step 960, the RFID ICs are singulated (i.e. separated from each other) by one or more of mechanical sawing, laser dicing, etching, annealing and breaking, or any other suitable singulation method, as described below in FIG. 11. In some embodiments step 950 may occur after step 960. Subsequently, at step 970, the ICs are placed onto straps or inlays, which include a substrate and patterned contacts (in the case or straps) or patterned antenna (in the case of inlays) as described above. As mentioned previously, adhesives may be applied to the inlays or the surface of the repassivation layer before attaching the RFID ICs to the inlays. In some embodiments, any applied material (e.g., layers or adhesives applied in step 950) that was not previously fully cured (e.g., as part of step 950) may be cured at optional step 980 using, for example, a thermal and/or mechanical process.

As described above, adhesives may be used to attach ICs to straps and/or to inlays. In some situations, uncured liquid adhesive may first be placed on a strap/inlay or an IC, and then the two brought together and the adhesive cured. Using uncured liquid adhesives for attaching ICs to straps/inlays can present several challenges. First, the temperature and humidity of the strap/inlay assembly line may affect the size and viscosity of a deposited adhesive drop, thus making it difficult to control adhesive placement and characteristics. Second, as uncured liquid adhesive ages, its viscosity changes, leading to waste during the drop deposition process and reduction in IC alignment accuracy. Third, an IC placed on uncured liquid adhesive may float, resulting in undesired movement and subsequent variations in placement, alignment, and performance. Finally, if a batch of uncured liquid adhesive is not used quickly enough, any remainder must be discarded, leading to further waste.

B-stage adhesives offer an alternative to uncured liquid adhesives for attaching ICs to straps/inlays. A B-stage adhesive is an adhesive material that can be partially cured (e.g., via the application of heat or radiation) into a stable intermediate state after initial deposition but before final assembly. According to embodiments herein, a B-stage adhesive can be applied to an IC or strap/inlay in a controlled environment and then first partially cured into the stable intermediate state. In the intermediate stable state, the B-stage adhesive is relatively easy to handle, and lacks many of the disadvantages of uncured liquid adhesives described above. Tag assembly is then performed with the B-stage adhesive in the stable intermediate state. Finally, the B-stage adhesive is completely cured after tag assembly is complete.

Figure 10:
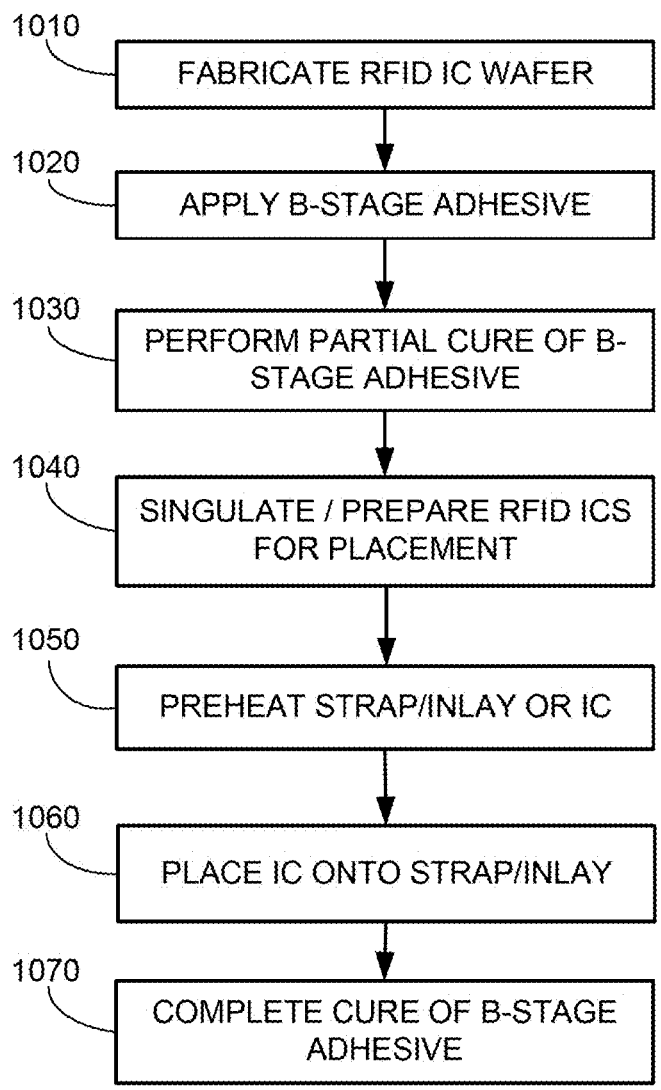
FIG. 10 is a flowchart of a process for attaching an RFID IC to an inlay using B-stage adhesives according to embodiments.

FIG. 10 is a flowchart of a process 1000 for attaching an RFID IC to a strap/inlay using a B-stage adhesive according to embodiments. In step 1010, an RFID IC wafer is fabricated (see, for example, FIG. 9). In some embodiments, repassivation and other conductive or nonconductive layers may be applied to the wafer and patterned as described in FIG. 9. After wafer fabrication and layer addition/patterning, a B-stage adhesive is applied to the wafer in step 1020. The B-stage adhesive may be applied by spin-coating, screen-printing, inkjet printing, or any other suitable application method. In some embodiments the B-stage adhesive may be applied in a relatively continuous layer over the entire wafer (e.g., as would be the case with spin-coating). In other embodiments the B-stage adhesive may be selectively applied to particular portion(s) of each IC on the wafer, for example using screen-printing, inkjet printing, high-speed offset printing, or any other suitable method for selective adhesive deposition. The B-stage adhesive may be electrically conductive or nonconductive.

In step 1030 the applied B-stage adhesive is partially cured into a stable intermediate state. The partial-curing process may involve exposure to ultraviolet radiation and/or heat. The resulting partially cured B-stage adhesive is typically stable, relatively solid, and not tacky, allowing ease of handling. Subsequently, in step 1040 the RFID ICs are singulated and prepared for placement onto straps/inlays, such as, for example, by mounting on wafer tape and dicing. In step 1050, a strap/inlay on which an IC is to be placed is preheated (e.g., via a laser, infrared radiation, a thermode, or any other suitable heating means). In step 1060, an IC with partially-cured B-stage adhesive in the stable intermediate state is placed onto the preheated strap/inlay, and the heat causes the partially-cured B-stage adhesive to soften and adhere to the strap/inlay. Alternatively, in other embodiments the surface of the IC with the B-stage material may instead (or also) be heated with a suitable heating means just prior to placement onto the surface of the strap/inlay. Finally, in step 1070 the B-stage adhesive may be completely cured by applying heat, pressure, and/or ultraviolet radiation.

Whereas in process 1000 the B-stage adhesive is applied to the ICs and partially cured into the stable intermediate state before singulation, in other embodiments the B-stage adhesive may be applied and/or partially cured after singulation (i.e., step 1040 may occur before step 1020 or before step 1030). In other embodiments the B-stage adhesive may be applied to the strap/inlay instead of (or in addition to) the ICs.

In other embodiments, multi-component adhesives (e.g., those with a binder and curing agent) may be used. For example, a first adhesive component (e.g., the binder or curing agent) may be applied to an IC and a second adhesive component (the other of the binder or curing agent) may be applied to the strap/inlay. The first and second adhesive components, when isolated, are stable and not tacky or sticky. Upon placement of the IC onto the strap/inlay, the two adhesive components contact each other to complete the adhesive, which then attaches the IC to the strap/inlay. In some embodiments, additional processing such as heat or pressure may be used to complete the adhesive.

As described above, RFID ICs on a wafer are singulated before placement on inlays. FIG. 11 illustrates a process 1100 for preparing ICs on a wafer for singulation, according to embodiments. In step 1102, ICs 1106 are fabricated as part of wafer 1104, similar to steps 910 and 1010 in FIGS. 9 and 10. Subsequently, in step 1108 a patterned photoresist layer 1110 is formed on the front side of wafer 1104, over the ICs. In embodiments as described herein, the photoresist has exposed channels 1112 surrounding the peripheries of the ICs. Photoresist layer 1110 may be patterned by coating wafer 1104 with the photoresist layer, exposing the photoresist layer to light through a photomask with a predefined pattern, and then developing the photoresist to remove portions of the photoresist corresponding to channels 1112 on the photomask. Channels 1112 expose "scribe streets" on wafer 1104, which are thin spaces between individual ICs that may be safely cut or removed to singulate but not damage the ICs. In some embodiments, the scribe streets may contain or overlap sacrificial circuit elements, interconnects, or wires that are not part of the ICs, but may be used for testing, characterization, and modification of the ICs while they are on the wafer.

Subsequently, in step 1114 wafer 1104 is cut along the scribe streets exposed by channels 1112 for singulating individual ICs 1106. Cuts 1116 may be formed using a number of different techniques, such as by using a saw or a laser to cut along the exposed scribe streets. In some embodiments cuts 1116 may be formed by etching, where exposed wafer material in the scribe streets is removed by reaction with etchant chemicals in a liquid or aqueous phase (wet etching), or with a chemically reactive gas or plasma (dry etching). Etching techniques may be isotropic, in which the etch rates are similar in all directions, or anisotropic, in which the etch proceeds faster in some directions (e.g., vertically or along a particular crystal plane). For a given etch rate, isotropic etching requires larger scribe street and channel widths than anisotropic etching, to prevent IC damage due to the horizontal etching associated with isotropic processes. Therefore, anisotropic etching is generally preferred for singulating ICs from a wafer. In some embodiments, cuts 1116 may use a multi-step etching process for fine etch control, such as by alternately forming a dielectric passivation layer on the sides of the cuts, partially etching the wafer in channels 1112, and then forming a dielectric passivation layer on the newly etched sides of the cuts. The shallow-etching process may be repeated a number of times to cut through the wafer. Cuts 1116 may use wet etching, dry etching, or a combination of wet and dry etching.

Figure 12:
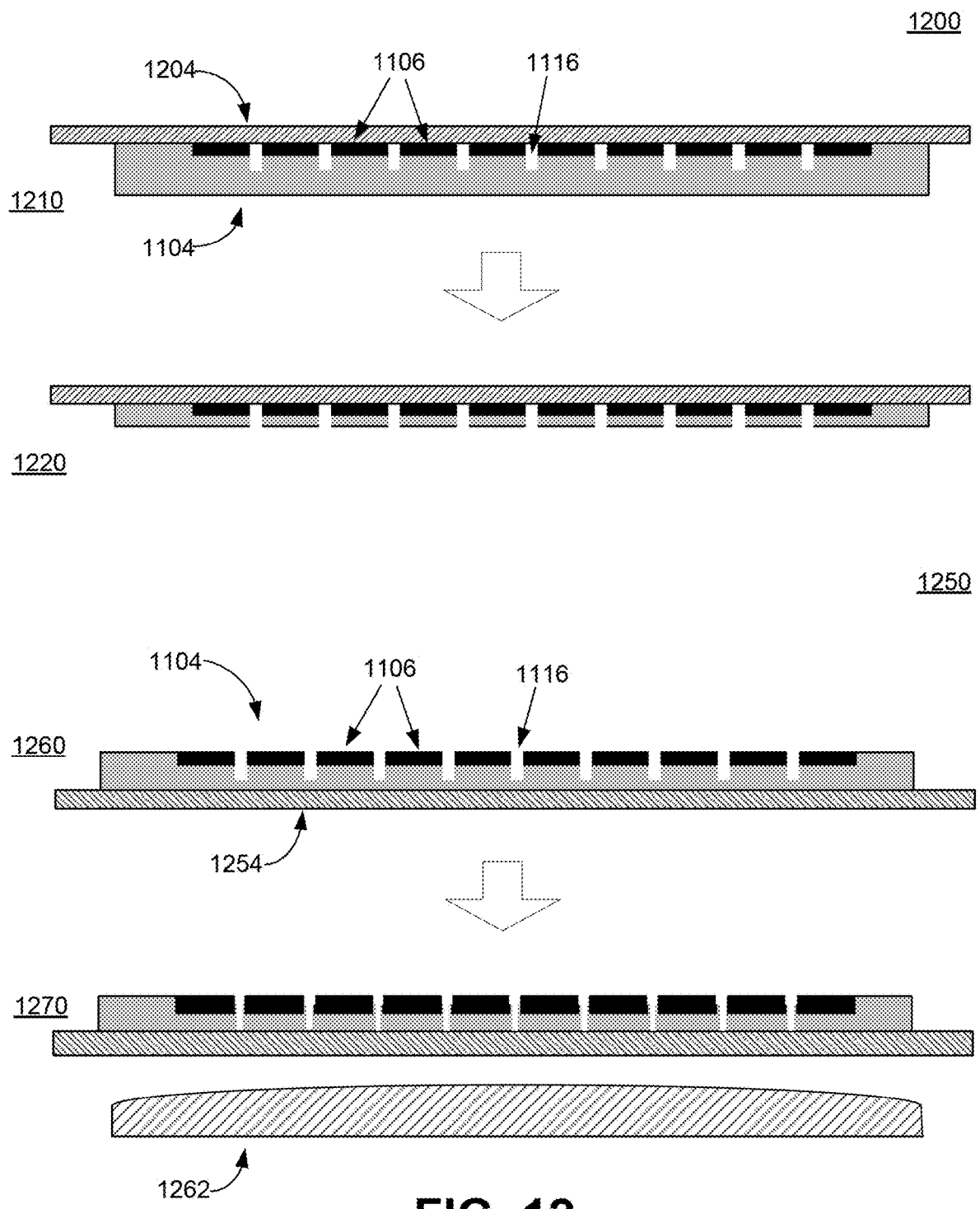
FIG. 12 illustrates processes for further singulating ICs from a wafer after the process of FIG. 11, according to embodiments.

In some embodiments, cuts 1116 only penetrate part way through the wafer, rather than all the way through the wafer, leaving the ICs only partially singulated. The ICs may then be fully singulated in a separate processing step. FIG. 12 illustrates processes 1200 and 1250 for fully singulating ICs from a partially etched wafer, according to embodiments. In step 1210 of process 1200, the front side of partially etched wafer 1104 is mounted on a protective tape 1204. In step 1220, wafer 1104 is thinned by a grinding process such as chemical-mechanical polishing/planarization (CMP) to remove material from the wafer backside until the ICs are singulated (i.e., until the wafer has been thinned to the bottoms of the cuts 1116).

Alternative process 1250 uses cuts 1116 to facilitate mechanically breaking the wafer along the scribe streets. Cuts 1116 create weaknesses in wafer 1104 such that, when a backside force is applied to wafer 1104, it breaks along cuts 1116, thus singulating ICs 1106. In step 1260, the backside of wafer 1104 (which may be background to reduce its thickness) is mounted on a protective tape 1254. Subsequently, in step 1270, the taped wafer backside is then drawn over a non-planar or rounded object or surface 1262 (e.g., a breaking object such as a mandrel or anvil, or an arch or ball), causing the wafer to break along the lines of cuts 1116. In an alternative approach, IC singulation may be performed by pulling or stretching tape 1254. The stress of pulling and stretching can cause the individual ICs to separate and pull apart along cuts 1116. Typically, the breaking causes little or no damage to the ICs.

In alternative embodiments the front side of wafer 1114 may be drawn over non-planar surface 1262. In yet other embodiments complete or partial cuts may be initiated from the back side of wafer 1104 rather than from the front side, and in the case of partial cuts the final separation may use any of the methods described above.

One advantage of using etching to singulate ICs is that non-rectangular ICs may be formed. Non-rectangular ICs have fewer or no sharp corners and less internal stress than square or rectangular ICs, resulting in improved IC strength. The absence of sharp corners may also reduce damage during handling or IC-inlay assembly. FIG. 13 depicts non-rectangular RFID ICs that may be formed using the singulation process of FIG. 11, according to embodiments. Diagram 1300 shows hexagonal ICs 1302, which pack closely on a wafer. Diagram 1350 shows octagonal ICs 1352. Octagons cannot pack as closely as hexagons, and so at least some wafer area may be lost. In some embodiments, the lost wafer area may be used for other ICs, such as rectangular IC 1354, thereby reducing the amount of wasted wafer area.

As described above in relation to FIG. 11, an etching process may employ a photoresist to align the wafer cuts or trenches that singulate ICs from the wafer. Unfortunately, in many instances, the stripping process that subsequently removes photoresist may damage structures formed on the surface of the IC, such as a repassivation layer. In some instances the stripping process may actually strip the repassivation layer from the IC as it strips the photoresist, obviating the benefits of depositing the repassivation layer in the first place. Depositing the repassivation layer after wafer etching may seem to address this issue, but in the case of partial wafer etching as described in FIG. 12 the repassivation layer may fill cuts (e.g., cuts 1116) and degrade the breaking process; in the case of complete wafer etching the repassivation layer may wrap around the sides of the ICs and cause irregular, poorly-shaped die.

Figure 14:
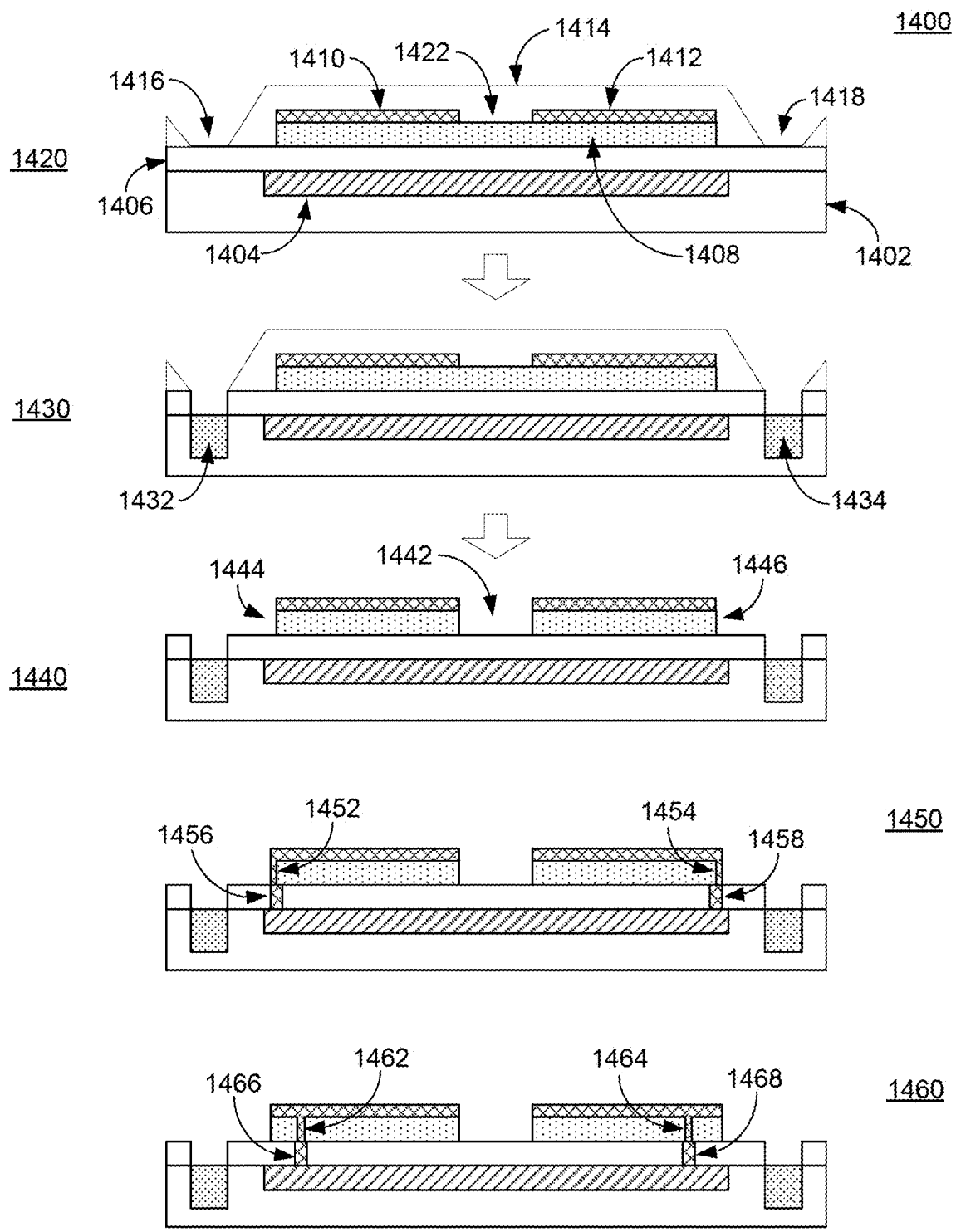
FIG. 14 illustrates how an etching process may also be used to form contact islands on an IC, according to embodiments.

Diagram 1400 in FIG. 14 illustrates how the etching process that singulates ICs also can also form protected contact islands, according to embodiments. Diagram 1400 depicts a cutaway portion of wafer 1402 showing circuitry 1404 of an individual IC. Circuitry 1404 is shown covered by an optional dielectric layer 1406, such as a glass or inter-layer dielectric (ILD). A repassivation layer 1408 (similar to repassivation layer 630) is disposed on the IC covering at least a portion of circuitry 1404. Large contact pads 1410 and 1412 (similar to large contact pads 808/810 and conductive redistribution layer 634) are deposited on repassivation layer 1408. Repassivation layer 1408 is partially exposed in the uncovered portion 1422 between contact pads 1410 and 1412. Referring to FIG. 8, uncovered portion 1422 may correspond to the IC surface between contact pads 808 and 810 in diagram 800 or contact pads 858 and 860 in diagram 850. In some embodiments, contact pads 1410/1412 may be deposited so as to cover at least a part of the side surfaces of repassivation layer 1408 (e.g., as described below in diagram 1450). In other embodiments, contact pads 1410/1412 may leave the side surfaces of repassivation layer 1408 entirely exposed. In some embodiments the covered side surfaces may be oriented vertically with respect to the wafer/IC surface, as shown in diagram 1450, whereas in other embodiments the covered side surfaces may be sloped with respect to the wafer/IC surface, as shown in FIG. 7.

Figure 11:
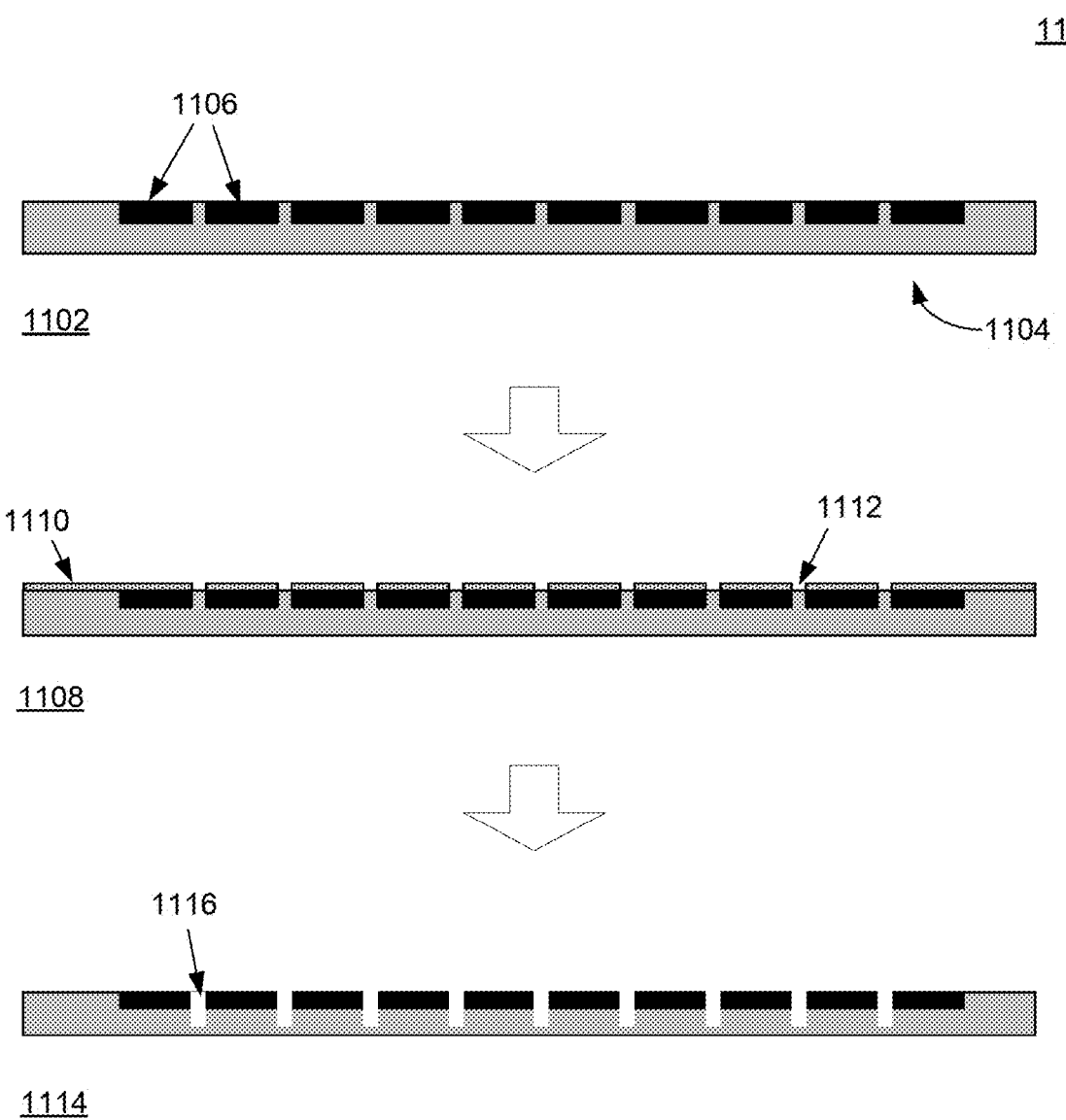
FIG. 11 illustrates a process for preparing ICs on a wafer for singulation, according to embodiments.

In preparation for the etching process described in FIG. 11, in step 1420 a masking layer 1414 (e.g. a photoresist) is applied to wafer 1402 and patterned to expose channels 1416 and 1418 for etching, similar to channels 1112 in FIG. 11. Subsequently, in step 1430 cuts 1432 and 1434 are etched through optional dielectric layer 1406 and into wafer 1402 at channels 1416 and 1418, for example using dry etching, wet etching, or a combination, as described in reference to FIG. 11.

In step 1440, masking layer 1414 is stripped from wafer 1402. Masking layer 1414 may be stripped using a dry process (e.g., plasma cleaning) or a wet process (e.g., solvent stripping). If masking layer 1414 includes organic material then the stripping process may be optimized to remove this organic material. If masking layer 1414 and repassivation layer 1408 both include organic components then the stripping process is likely to remove exposed portions (e.g. uncovered portion 1422) of repassivation layer 1408 along with masking layer 1414. While inadvertent and detrimental in some situations, in other situations this stripping process may allow patterning structures on the IC by removing exposed portions of repassivation layer 1408 in one step.

Contact pads 1410/1412 may cover some regions of repassivation layer 1408, and expose other regions such as uncovered portion 1422. In step 1440, when masking layer 1414 is stripped, exposed repassivation layer portion 1422 may also be removed to form a trench or cavity 1442. By contrast, those portions of repassivation layer 1408 that underlie contact pads 1410/1412 will remain protected and undamaged from the stripping agent by the (typically metallic) contact pads (with the potential exception of some undercut near the pad edges). As a result, raised or elevated contact islands 1444 and 1446 may be formed, each with a top layer corresponding to contact pad 1410 or 1412 and a bottom layer corresponding to repassivation material underlying contact pads 1410/1412. Of course, repassivation material 1414 need not be fully removed from trench 1442; step 1440 shows full removal solely for reasons of clarity.

In some embodiments, other layers may be interposed between the top layer and the bottom layer of a contact island, or between the contact island and optional dielectric layer 1406 of the IC. These other layers may include additional dielectric layers or conductive layers, and may be used to adjust the physical and/or electrical (e.g., conductive, capacitive, inductive, etc.) characteristics of the contact island.

In some embodiments, raised contact islands 1444 and 1446 may include side contacts 1452 and 1454, respectively, as shown in diagram 1450. Side contacts 1452/1454 are similar to side contact 710 described above in FIG. 7, and may provide electrical coupling between contact pads 1410/1412 and circuitry 1404. In some embodiments they may galvanically connect contact pads 1410/1412 and circuitry 1404 through vias 1456 and 1458 if optional dielectric layer 1406 is present. In other embodiments, side contacts 1452/1454 may galvanically connect contact pads 1410/1412 to circuitry 1404 by physically contacting IC contacts (not shown) associated with circuitry 1404. Side contacts 1452/1454 may also (or instead) protect the sides of the repassivation layer portions underlying contact pads 1410/1412 from the stripping process described above. Side contacts 1452/1454 may be deposited as part of contact pads 1410/1412 or may be deposited separately.

In some embodiments, contact pads 1410/1412 may electrically couple to circuitry 1404 through repassivation layer vias 1462 and 1464 and optional dielectric layer vias 1466 and 1468 if optional dielectric layer 1406 is present, as shown in diagram 1460. In these embodiments, the side surfaces of raised contact islands 1444/1446 may be fully protected (e.g., by side contacts 1452/1454), partially protected, or entirely exposed.

Whereas masking layer 1414 is described as being used to form channels for etching, in other embodiments masking layer 1414 (or another masking layer) may be used for implantation processes. Implantation processes are used in IC fabrication to modify the physical or electronic behavior of certain portions of a wafer. For example, ions may be implanted into portions of wafer 1402 and/or overlying layers to form doped regions with higher electrical conductivity. Mask layers, such as masking layer 1414, may be used to guide implantation processes by selectively exposing portions of wafer 1402 to be doped or implanted.

In some embodiments the repassivation layer may be resistant to an etchant or to an etching process. In these embodiments the repassivation layer itself may be used as the masking layer, obviating the need for a separate masking layer 1414. Diagram 1500 in FIG. 15 illustrates how such a repassivation layer may serve as a mask in an etching process, according to embodiments. Diagram 1500 depicts a cutaway portion of wafer 1502 (similar to wafer 1402) showing circuitry 1504 of an individual IC. A repassivation layer 1508 with optionally sloped sides (similar to repassivation layer 630 in FIG. 7) is disposed on the IC, covering at least a portion of circuitry 1504. In some embodiments, repassivation layer 1508 may be disposed to uncover or expose all or a portion of IC contact 1524, which is typically a metallic contact on the surface of IC 1502 and which is electrically coupled to circuitry 1504, similar to IC contact 633 in FIG. 7.

Diagram 1520 shows contact pads 1510 and 1512 (similar to contact pads 1410/1412) disposed on repassivation layer 1508. In some embodiments, one or both contact pads may be disposed so as to extend beyond the periphery of repassivation layer 1508, thereby forming a side contact (similar to side contact 710 in FIG. 7) that physically contacts and galvanically couples to IC contact 1524.

Repassivation layer 1508 may be patterned so as to expose channels 1516 and 1518 (similar to channels 1416 and 1418) for etching. In some embodiments, contact pads 1510/1512, contact pads on adjacent ICs on the wafer, and/or other IC portions that resist the etching process (e.g., IC contact 1524) may also serve as masking layers. For example, IC contact 1524, along with a repassivation layer on an adjacent IC, may be fabricated to expose channel 1516 for etching. Subsequently, in step 1530 cuts 1532 and 1534 may be etched into wafer 1502 at channels 1516 and 1518, for example using dry etching, wet etching, or a combination, as described in reference to FIG. 11. In some embodiments, exposed portions of repassivation layer 1508 may also be at least partially removed during the etching in step 1530, although this is not shown in FIG. 15.

Figure 16:
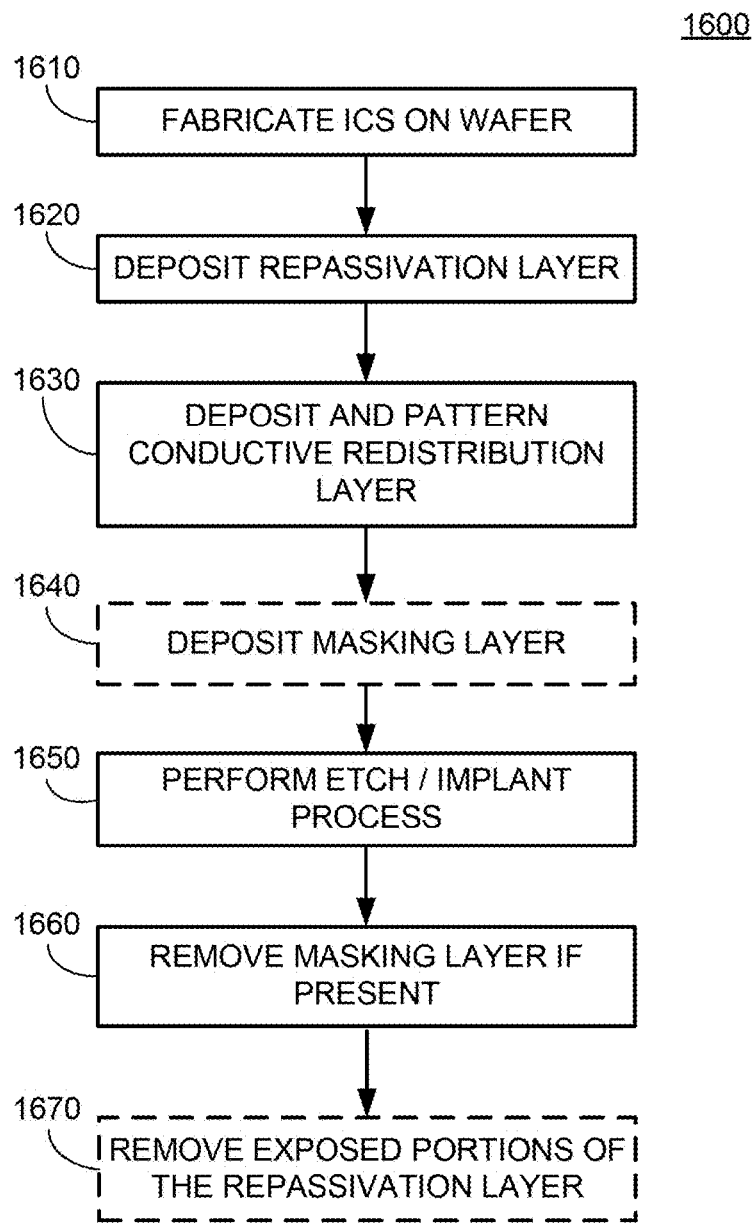
FIG. 16 is a flowchart of a process for forming contact islands on an IC, according to embodiments.

FIG. 16 is a flowchart of a process 1600 for forming contact islands on an IC, according to embodiments. In step 1610, ICs are fabricated on a wafer, as described above in FIGS. 9 and 10. In step 1620, a repassivation layer (e.g., repassivation layer 1408) is deposited on the wafer. In step 1630, a conductive redistribution layer (e.g., conductive redistribution layer 634) is deposited on the repassivation layer and patterned as described above in FIG. 8. The conductive redistribution layer may be patterned to form contact pads (e.g., contact pads 1410/1412) that also function to protect underlying portions of the repassivation layer. In optional step 1640 a masking layer (e.g., masking layer 1414) may be deposited on the wafer and patterned to expose portions of the wafer. The masking layer may expose channels for singulation (e.g., channels 1416/1418), or may expose portions of the wafer for implantation. In other embodiments the repassivation layer, the conductive redistribution layer, and/or other elements on the IC may be used as masks that expose channels for singulation or portions of the wafer for implantation. In step 1650, an etching or implantation process is performed at the exposed wafer portions, and in step 1660 a stripping process removes the masking layer if present. In some embodiments, portions of the repassivation layer not protected by the conductive redistribution layer may be removed in optional step 1670 to form raised contact islands (e.g., raised contact islands 1444/1446). The repassivation layer portions may be removed using the stripping process in step 1660 or an entirely separate stripping process.

FIG. 17 depicts contact islands patterned to facilitate IC alignment during IC-to-strap or -inlay assembly. Diagram 1700 shows a perspective view of IC 1702 with raised contact islands 1704 and 1706, similar to raised contact islands 1444 and 1446. Trench 1708, similar to trench 1442, separates contact islands 1704 and 1706. In some embodiments the strap/inlay will have a raised feature sized to fit within trench 1708 at a desired location on the strap/inlay. When IC 1702 is placed onto the strap/inlay, the raised feature fits into trench 1708, thus guiding IC 1702 to it desired location and aligning it with a desired orientation. Additional alignment patterning, such as notch 1710 in raised contact island 1704, can further refine the accuracy and orientation of the IC-to-strap/inlay assembly by mating with matching features on the strap/inlay. In some embodiments, IC assembly onto a strap/inlay may use physical processes such as vibration, gravity, electrostatic or magnetic attraction/repulsion, fluidic motion or surface tension, or any other suitable process to maneuver the IC so its alignment patterns mate with the corresponding alignment features on the strap/inlay.

Diagram 1750 is a perspective view of IC 1752 showing another of the many possible raised-contact-island patterns that may be used for IC alignment during IC-to-strap/inlay assembly. Raised contact islands 1754 and 1756 are separated by a trench 1758 (similar to trench 1708), that is expanded in alignment region 1760. A strap or inlay on which IC 1752 is to be assembled may have an alignment feature shaped to mate with trench 1758 and alignment region 1760. Like for IC 1702, when IC 1752 is assembled on a strap/inlay the raised-contact-island pattern mates with the corresponding alignment features on the strap/inlay, thereby causing IC 1752 to assemble in the desired location and with the desired orientation.

As described above, a contact island may include a top layer comprising a large contact pad and a bottom layer comprising a repassivation layer. In some embodiments at least part of one or more side surfaces of the repassivation layer may be covered by side contacts or side-protection-layers 1452/1454, as described above. For example, the side surfaces of the contact islands in diagrams 1700 and 1750 may employ such side layers (as indicated by the light gray shading), while the interior surfaces facing trenches 1708/1758, notch 1710, and/or alignment region 1760 may not be protected (as indicated by the lack of shading).

Whereas the sides of contact islands 1444/1446, 1704/1706, and 1754/1756 are depicted as substantially vertical with respect to the IC surface, at least a portion of the contact-island sides may optionally be slanted, tilted, beveled, or otherwise substantially nonvertically-sloped with respect to the IC surface, such as depicted in FIGS. 7 and 15. The substantially nonvertical slope may be relatively steep (i.e., having an angle of inclination with respect to the IC surface of 50, 60, 70, or 80 degrees), relatively shallow (i.e., having an angle of inclination with respect to the IC surface of 10, 20, 30, or 40 degrees), or somewhere in between. In some embodiments, the slope may be shaped by a mask removal/etching process; in other embodiments the slope may be shaped during or as a product of the deposition of the repassivation layer.

The steps described in processes 900, 1000, and 1600 are for illustration purposes only. An RFID IC may be patterned, singulated, and assembled onto a strap or inlay using additional or fewer steps using the principles described herein.

The order of steps may be modified, some steps eliminated, or other steps added. And the utility of the processes 900 and 1000 may be extended as would be obvious to one of ordinary skill in the art, such as for placing an RFID IC onto a printer-circuit board. Finally, in embodiments where the RFID IC is placed onto a strap, additional steps may be required to fabricate an RFID tag from the IC-strap combination.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented, according to embodiments formed, individually and/or collectively, by a wide range of hardware, software, firmware, or virtually any combination thereof.

Embodiments as described herein additionally include programs, and methods of operation of the programs. A program is generally defined as a group of steps or operations leading to a desired result, due to the nature of the elements in the steps and their sequence. A program is usually advantageously implemented as a sequence of steps or operations for a processor, such as the structures described above.

Performing the steps, instructions, or operations of a program requires manipulation of physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

Executing a program's steps or instructions may further require storage media that have stored thereon a program's instructions and/or data, typically in a machine-readable form. This storage media is typically termed a memory, read by a processor or other machine element. In electronic devices the memory may be implemented in any of the ways described above, and may be volatile or nonvolatile.

Even though it is said that the program may be stored in a computer-readable medium, it should be clear to a person skilled in the art that it need not be a single memory, or even a single machine. Various portions, modules or features of it may reside in separate memories, or even separate machines. The separate machines may be connected directly, or through a network such as a local access network (LAN) or a global network such as the Internet.

Often, for the sake of convenience only, it is desirable to implement and describe a program as software. The software can be unitary, or thought in terms of various interconnected distinct software modules.

This detailed description is presented largely in terms of flowcharts, algorithms, and symbolic representations of operations on data bits on and/or within at least one medium that allows computational operations, such as a computer with memory. Indeed, such descriptions and representations are the type of convenient labels used by those skilled in programming and/or the data-processing arts to effectively convey the substance of their work to others skilled in the art. A person skilled in the art of programming may use these descriptions to readily generate specific instructions for implementing a program according to the present invention.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

We claim:

1. A Radio Frequency Identification (RFID) tag comprising:
   a tag substrate having an antenna;
   an integrated circuit (IC) assembly comprising:
      an IC with an IC contact;
      a nonconductive repassivation layer deposited on the IC that exposes at least a portion of the IC contact and does not surround the IC contact, and
      a conductive redistribution layer deposited on the nonconductive repassivation layer and coupled to the IC contact by a first galvanic connection, wherein the conductive redistribution layer covers a portion of the IC contact, and
   a nonconductive barrier present on one of the antenna and the conductive redistribution layer, disposed between the antenna and the IC assembly, and having a first opening, wherein the conductive redistribution layer is confined within a perimeter of the IC and is coupled to the antenna by a second galvanic connection through the first opening.

2. The tag of claim 1, wherein the first opening is formed at least by physical breaking.

3. The tag of claim 1, wherein the nonconductive barrier is at least one of an oxide and a masking layer.

4. The tag of claim 1, wherein:
   the conductive redistribution layer includes a side contact that covers at least a portion of a side surface of the nonconductive repassivation layer; and
   the side contact extends beyond a periphery of the nonconductive repassivation layer to cover at least the portion of the IC contact and form the first galvanic connection.

5. The tag of claim 4, wherein an exposed surface of a portion of the side contact forms a substantially nonvertical slope relative to the surface of the IC and the side contact portion covers the side surface portion of the nonconductive repassivation layer.

6. The tag of claim 1, wherein the conductive redistribution layer includes at least two conductive portions electrically isolated from each other.

7. The tag of claim 6, wherein:
   one of the at least two conductive portions forms the second galvanic connection, and
   another one of the at least two conductive portions forms a third galvanic connection to the antenna through a second opening physically separated from the first opening.

8. A method for assembling a Radio Frequency Identification (RFID) tag, the method comprising:
   receiving a tag substrate including an antenna;
   receiving an integrated circuit (IC) assembly comprising:
      an IC with an IC contact;
      a nonconductive repassivation layer deposited on the IC that exposes at least a portion of the IC contact and does not surround the IC contact, and
      a conductive redistribution layer deposited on the nonconductive repassivation layer and coupled to the IC contact by a first galvanic connection, wherein the conductive redistribution layer is confined within a perimeter of the IC and covers a portion of the IC contact;
   forming a first opening in a nonconductive barrier present on one of the antenna and the conductive redistribution layer; and
   forming a second galvanic connection that couples the conductive redistribution layer to the antenna through the first opening.

9. The method of claim 8, further comprising forming the first opening using at least physical breaking.

10. The method of claim 8, wherein the nonconductive barrier is at least one of an oxide and a masking layer.

11. The method of claim 8, wherein:
   the conductive redistribution layer includes a side contact that covers at least a portion of a side surface of the nonconductive repassivation layer; and
   the side contact extends beyond a periphery of the nonconductive repassivation layer to cover at least the portion of the IC contact and form the first galvanic connection.

12. The method of claim 11, wherein an exposed surface of a portion of the side contact forms a substantially non-vertical slope relative to the surface of the IC and the portion of the side contact covers the side surface portion of the nonconductive repassivation layer.

13. The method of claim 8, wherein the conductive redistribution layer includes at least two conductive portions electrically isolated from each other.

14. The method of claim 13, further comprising:
   forming the second galvanic connection using a first one of the at least two conductive portions; and
   forming a third galvanic connection to the antenna through a second opening physically separated from the first opening using a second one of the at least two conductive portions.

15. A Radio Frequency Identification (RFID) integrated circuit (IC) assembly comprising:
   an IC with an IC contact;
   a nonconductive repassivation layer deposited on the IC that exposes at least a portion of the IC contact and does not surround the IC contact, and
   a metallic conductive redistribution layer deposited on the nonconductive repassivation layer, wherein:
      the conductive redistribution layer is confined within a perimeter of the IC;
      the conductive redistribution layer covers a portion of the IC contact;

the conductive redistribution layer has an exposed conductive surface, at least a portion of which forms a substantially nonvertical slope with respect to a surface of the IC contact; and the conductive redistribution layer is coupled to the IC contact by a first galvanic connection.

16. The assembly of claim 15, wherein:

the sloped portion of the conductive redistribution layer forms a portion of a side contact; and the side contact extends beyond a periphery of the non-conductive repassivation layer and covers at least the portion of the uncovered IC contact to form the first galvanic connection.

17. The assembly of claim 15, wherein the conductive redistribution layer includes at least two conductive portions electrically isolated from each other.

\* \* \* \* \*

UNITED STATES PATENT AND TRADEMARK OFFICE
CERTIFICATE OF CORRECTION

PATENT NO. : 11,423,278 B1
APPLICATION NO. : 17/209514
DATED : August 23, 2022
INVENTOR(S) : Ronald L. Koepp et al.

It is certified that error appears in the above-identified patent and that said Letters Patent is hereby corrected as shown below:

On the Title Page

Column 2 (Item (57) Abstract), Line 6, Delete "IC IC" and insert -- IC --, therefor.
In Page 2, Column 1 (Related U.S. Application Data), Line 2, Delete "which" and insert -- said application No. 14/132,959 --, therefor.
In Page 2, Column 1 (Related U.S. Application Data), Line 4, Delete "and" and insert -- which is --, therefor.

Signed and Sealed this
Thirteenth Day of June, 2023

Katherine Kelly Vidal
*Director of the United States Patent and Trademark Office*